(12) United States Patent
Berger et al.

(10) Patent No.: US 8,355,259 B2
(45) Date of Patent: Jan. 15, 2013

(54) DEMOUNTABLE DRY CONNECTION FOR FLEXIBLE CIRCUITS TO CIRCUIT BOARDS

(75) Inventors: Christoph Berger, Bem (CH); Laurent Dellmann, Rüschlikon (CH); Stefano S. Oggioni, Milan (IT)

(73) Assignee: International Business Machines Corporation, Armonk, NY (US)

( * ) Notice: Subject to any disclaimer, the term of this patent is extended or adjusted under 35 U.S.C. 154(b) by 238 days.

(21) Appl. No.: 12/631,696

(22) Filed: Dec. 4, 2009

(65) Prior Publication Data

US 2011/0134614 A1    Jun. 9, 2011

(51) Int. Cl.
*H05K 1/00* (2006.01)

(52) U.S. Cl. ............................................... 361/749

(58) Field of Classification Search .............. 361/749, 361/767, 773–774, 783, 803; 174/257, 259–261
See application file for complete search history.

(56) References Cited

U.S. PATENT DOCUMENTS

| | | | |
|---|---|---|---|
| 6,812,412 B2 | 11/2004 | Obata et al. | |
| 7,152,318 B2 | 12/2006 | Kim et al. | |
| 7,479,792 B2 | 1/2009 | Mathieu et al. | |
| 2009/0289362 A1* | 11/2009 | Rhyner et al. | 257/738 |
| 2009/0300914 A1* | 12/2009 | Hougham et al. | 29/874 |

FOREIGN PATENT DOCUMENTS

| | | |
|---|---|---|
| JP | 11186726 A2 | 7/1999 |
| WO | 2008004382 A1 | 1/2008 |

OTHER PUBLICATIONS

Berger, C. et al., "Integration of Optical I/O with Organic Chip Packages", Photonics Packaging, Integration, and Interconnects VIII, Proceedings of the SPIE, vol. 6899, SPIE, Feb. 6, 2008, pp. 1-9, United States.

Braunisch, H. et al., "Flex-Circuit Chip-to-Chip Interconnects", 2006 Electronic Components and Technology Conference, IEEE, 2006, pp. 1853-1859, United States.

* cited by examiner

*Primary Examiner* — Jeremy Norris
*Assistant Examiner* — Tremesha S Willis
(74) *Attorney, Agent, or Firm* — DeLizio Gilliam, PLLC

(57) ABSTRACT

Substrates are connected by demountable coupling by connecting an electronic module to a substrate. An electronic module and a substrate carrying electrical and/or optical circuits are provided. A connector electrical circuit is connected between the substrate and the electronic module. The connector electrical circuit is electrically demountable dry connected to the electronic module.

16 Claims, 12 Drawing Sheets

DEMOUNTABLE DRY CONNECTION FOR FLEXIBLE CIRCUITS TO CIRCUIT BOARDS

BACKGROUND

1. Field of the Invention

The invention relates generally to circuit boards and in particular to optical circuit boards.

2. Background Information

Meeting the requirements of highly integrated systems requires bringing communication interfaces such as communication optics closer to the microprocessors. This in turn requires interconnecting sub-assemblies and carrying electro-optic transceiver modules to chip carriers. However, temperature excursions (including the soldering operations for modules or chip on carriers) can damage optics. Optical parts are not designed for exposure to high temperatures or to multiple temperature cycles with temperatures involved in soldering cycles (e.g., 230° C. and above).

Conventional implementations utilize flexible circuits (e.g., made of Polyimide PI, Liquid Crystal Polymer LCP, Benzocyclobutene BCB, and other materials) that are soldered to a matrix of contacts (loosing field upgradeability/repair options), or mounted by the use of Z-axis interconnection materials (e.g., in the form of foils, rubber, matrix of contacts).

Interconnection materials such as electrical interposers are usually polymers/plastics loaded, using different techniques, with metal particles in the form of needles, flakes, spheres or other shapes. When these interposers are compressed by a vertical load, the dispersed metal particles come in contact between the interposers and provide a vertical electrical connection/path between the two opposite surfaces of the interposer material, establishing an electrical connection, for example, between the flex cable and the substrate. This vertical connection allows the transfer of electrical signals which are then transferred to the optical devices mounted on the flex substrate.

Interposers represent a further mounting step in the sequence of product assembly, and also represent at least a further double interface (i.e., flex to interposer and interposer to chip carrier), negatively affecting quality of the electrical signal being transmitted (signal degradation due to impedance/transmission line discontinuities on the transmission line and Ohmic resistance in the electrical interconnect).

BRIEF SUMMARY

Substrates are connected by demountable coupling. One embodiment comprises connecting an electronic module to a substrate, by providing an electronic module and a substrate carrying electrical and/or optical circuits. A connector electrical circuit is connected between the substrate and the electronic module, wherein the connector electrical circuit is electrically demountable dry connected to the electronic module.

Another embodiment comprises connecting an electronic module to a substrate by providing an electronic module, a substrate carrying electrical and/or optical circuits, and a flexible electrical circuit for connection between the substrate and the electronic module. The flexible electrical circuit has a first compatible interface area for connection to the electronic module, and the first compatible interface area includes a first overgrown metal pad with noble metal finishing. The electronic module includes a second compatible interface area for connection to the flexible electrical circuit, the second compatible interface area includes a second metal pad with noble metal finishing metallurgical compatible with the finishing of the first overgrown metal pad. The first pad into bi-dimensional arrays is placed on the flexible electrical circuit and the flexible electrical circuit is connected between the substrate and the electronic module. The flexible electrical circuit is electrically demountable dry connected to the electronic module, such that when in contact the first and second metal pads self adjust one into the other based on applied vertical loading connecting electrically differing parts.

Another embodiment comprises an electronic module, a substrate carrying electrical and/or optical circuits, and a flexible electrical circuit for connection between the substrate and the electronic module. The flexible electrical circuit comprises a first compatible interface area for connection to the electronic module, and the first compatible interface area includes a first overgrown metal pad with noble metal finishing. The electronic module comprises a second compatible interface area for connection to the flexible electrical circuit, and the second compatible interface area comprises a second metal pad with noble metal finishing metallurgical compatible with the finishing of the first overgrown metal pad. The flexible electrical circuit is configured to be connected between the substrate and the electronic module, wherein the flexible electrical circuit may be electrically demountable dry connected to the electronic module. When in contact the first and second metal pads self adjust one into the other based on applied vertical loading connecting electrically differing parts.

Other aspects and advantages of the invention will become apparent from the following detailed description, which, when taken in conjunction with the drawings, illustrate by way of example the principles of the invention.

BRIEF DESCRIPTION OF THE SEVERAL VIEWS OF THE DRAWINGS

For a fuller understanding of the nature and advantages of the invention, as well as a preferred mode of use, reference should be made to the following detailed description read in conjunction with the accompanying drawings, in which.

DETAILED DESCRIPTION

Figure 1:
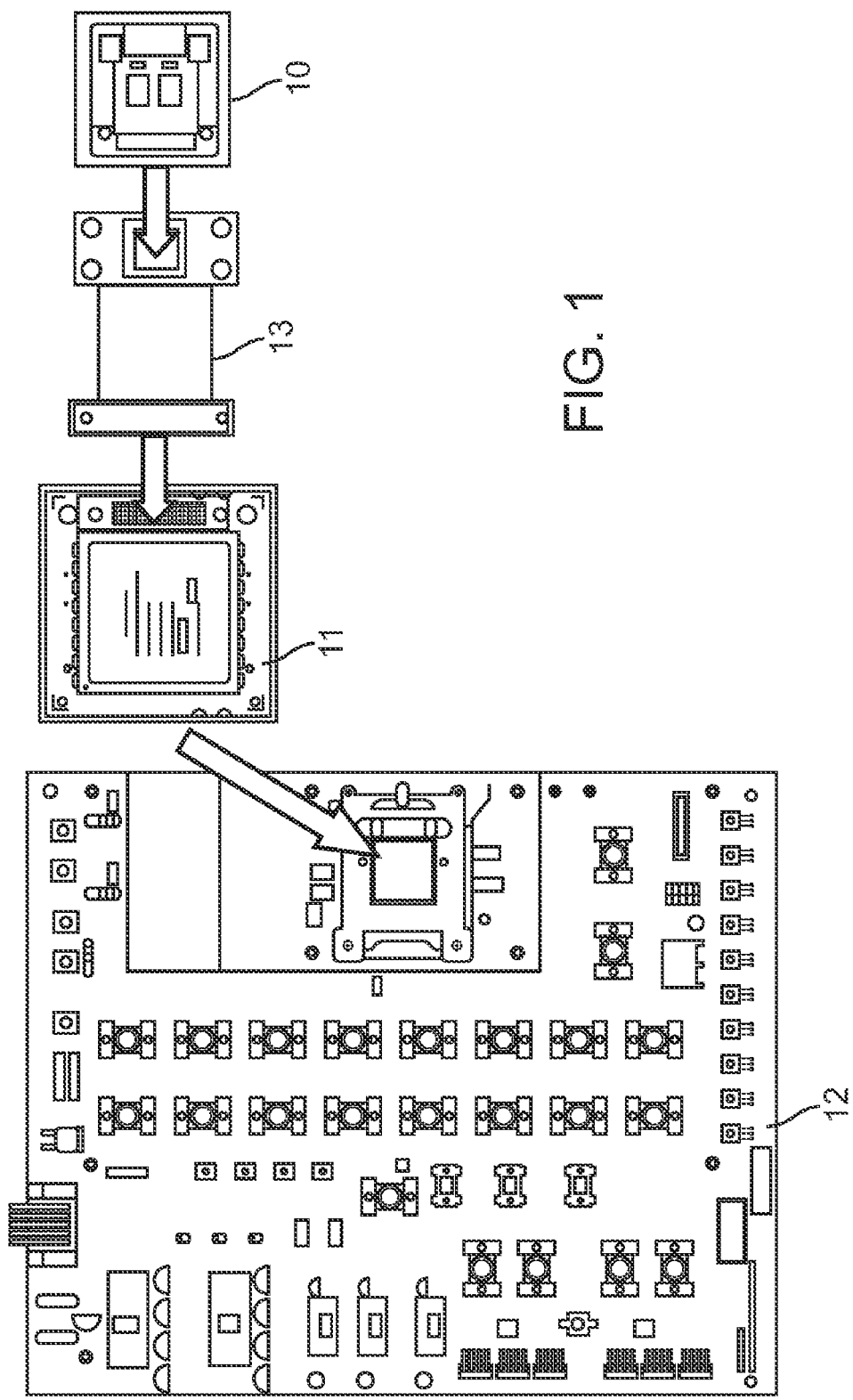
FIG. 1 shows a process for connection of an optical circuit board to an electronic module, according to an embodiment of demountable dry connection disclosed herein.

The following description is made for the purpose of illustrating the general principles of the invention and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

The invention provides a demountable connection between electronic circuits. One implementation involves demountable dry connection of flexible electrical circuits (e.g., flex cables) to optical circuit boards. In one embodiment, a mounting scheme is provided which allows decoupling delicate components (mostly related to optical or magnetic interfaces), from other electronics which can withstand severe process conditions. An implementation involves a demountable coupling of an optical sub-assembly to said other electronics at system level at a separate stage of the system assembly, or at test, with separate test cycles. Such a demountable coupling provides a safer process for the optics at factory system assembly. Such a demountable coupling further allows upgradeability and repair in the field without replacement of higher hierarchical sub-system.

One application in where there are limitations in material properties or hierarchical sequences to enable/sustain construction steps (i.e., process steps temperatures, rework ability, test, security code loading/configuration) or other combinations when more delicate parts are required to be merged into more complex assemblies. As an example application involves use of an optical circuit device (temperature sensitive) with an electronic module which has to abide to industry standard requirements for use in mass production of electronics.

One implementation involves providing an optical circuit board ("card"); providing a flexible electrical circuit ("flex"); and connecting the flexible electrical circuit between the optical circuit board and the electronic module, wherein the flexible electrical circuit is demountable dry connected to the electronic module. Demountable and dry mean that there are no further elements contributing/enabling the electrical interconnection between the different substrates (i.e., card and flex) such as electrical interposers. Demountable is used with the concept that is "simple" by design where parts can be separated and re-joined without the worry of aligning a third piece of material (generally a loose part in between the electrical matrix of contacts, usually in cramped areas). This eliminates the need for design implications in forecasting the handling and the necessary load of electrical interposers which have a significant different Ohmic behavior based on load of the clamping mechanism.

The flexible electrical circuit may include a compatible interface area for connection to the electronic module, and the electronic module may include a compatible interface area for connection to the flexible electrical circuit, such that the flexible electrical circuit is demountable dry connected to the electronic module. In one example, a compatible interface area of the flexible electrical circuit may include a metal pad with finishing metallurgical compatible with a corresponding pad of the electronic module. In another example, a compatible interface area of the electronic module may include a metal pad with finishing metallurgical compatible with a corresponding pad of the flexible electrical circuit. In yet another example, a compatible interface area of the electronic module may include a metal pad with finishing metallurgical compatible with a corresponding pad of the flexible electrical circuit, said corresponding pad itself including a finishing metallurgical compatible with said pad of the electronic module.

The electronic module may be manufactured following a standard manufacturing process, and the flexible electrical circuit and the optical circuit board may be manufactured according to the safest procedures to preserve functionalities in the most delicate and sensible devices. In the case of optics there may be many mismatches between what an optical element can withstand (in terms of temperatures or in terms of resistance to chemical compounds), and what is usually addressed for standard electronic components. The same applies to elements with other properties such as ferromagnetic materials (heads), which cannot be exposed to temperatures above specific limits without sustaining damage. All critical parts can be manufactured and tested according to their specific requirements, and then connected together as a whole, such as an electronic module or electronic node. According to an embodiment of the invention, the connection is performed by stacking one or more parts such as the flexible electrical circuit by a demountable dry connection to the electronic module via a demountable coupling. The electronic module may comprise a carrier for a chip mounted thereon, and the optical circuit board may include an optical transceiver module.

Providing a demountable coupling according to an embodiment of the invention may include performing plating to obtain an overgrowth of plating structures, providing increased thickness of plated structures to overcome different heights and planarity features an array for signal transfer. In one example, an overgrown metal can be achieved directly in all phases wherein the base metal of the circuit is addressed in the manufacturing process (e.g., copper (Cu) in most flexible circuits), reaching a higher thickness (e.g., up to 45 μm in place of the standard 21 to 25 μm). The process then continues with standard finishing, compatible to sockets or connectors (e.g., noble metals such as gold 0.1 to 0.6 μm over nickel 4 to 8 μm). In another example, copper features may be selectively covered by overgrown metalizations made of a different metal than copper (e.g., nickel). A base material for a flexible circuit bearing the metal structures is a material which presents specific properties in nature (e.g., elastic modulus, Poisson ratio, CTE, temperature of glass transition), which upon undergoing exercised pressure by a clamping mechanism results in a material that tends to adjust itself to be compliant with the mating surfaces. The plating structures represent main rigid structures crossing vertically one or more layers of flexible materials composing the flexible circuit board. The plating structures become the only structures bearing the compressive load which guarantees their level of mating force against homologous pads existing on the other substrate/interface. The overgrown metal contacts overcome the differences of height of the different interfaces.

The metalization also allows implementing actions for better compliance between the contacts. For example, according to another implementation of the invention, different metalized structures may be used which present onto their surfaces a compatible metal finishing (e.g., gold on both mating surfaces) while the underlying metal layer(s) of each individual structure may present a different level of hardness resulting in a mating mechanism which has the capability to penetrate one into the other. For example, a copper pad that is directly soft gold plated is softer than an analogous copper pad which has sustained a nickel plating and a soft gold plating on top of the nickel. The result is a compression of the gold layers but with the nickel acting as a reinforced layer. These levels of different metalized layers can be processed for different levels of penetration and different areas of applications such as the mounting of optical devices, MEMS, and stacking of different structures without the need for intervention of chemical additives to remove oxides or high temperatures.

Interconnections can be made across the thickness of a flexible dielectric, such as by mechanical drilling or others may use laser drilling or material laser assisted ablation mixed with selective metal etching. The differences in manufacturing need not change the final result of rigid metalized structures embedded into a dielectric media, allowing connection of one pad within one or more layers of a substrate, to pads of another substrate by the application of a pressure/clamping method.

Providing a demountable coupling may further include applying a compression force to the flexible circuit board via a non-conductive clamp, resulting in contact with a multi-array pad matrix on the chip carrier, establishing a direct contact with the flexible circuit board. Providing a demountable coupling may further include: improving level of contact quality by removal of masking materials, reducing the possibility of errors in aligning pads over insulators surrounding the pads, either on the chip carrier or the flexible circuit cable to obtain a more reliable contacting mechanism in multiple plug/unplug operations. The process may further include plating contacts with a layer of Ni, and a flash of one or more of: Au, Ni, thick Au, Ni/Au/Pd, Chemical Tin, Ni/Pd/Au, Ag, Pt, Ni/Au/Rhodium.

FIG. 1 shows an example process for demountable dry connection of a flexible circuit to an optical board, according to an embodiment of the invention. Specifically, FIG. 1 shows a top view of an electro-optical processor package assembly process, using demountable dry connection of an optical sub-assembly 10 to other electronics 11 on a system board 12 via a flexible electrical circuit 13.

Figure 2:
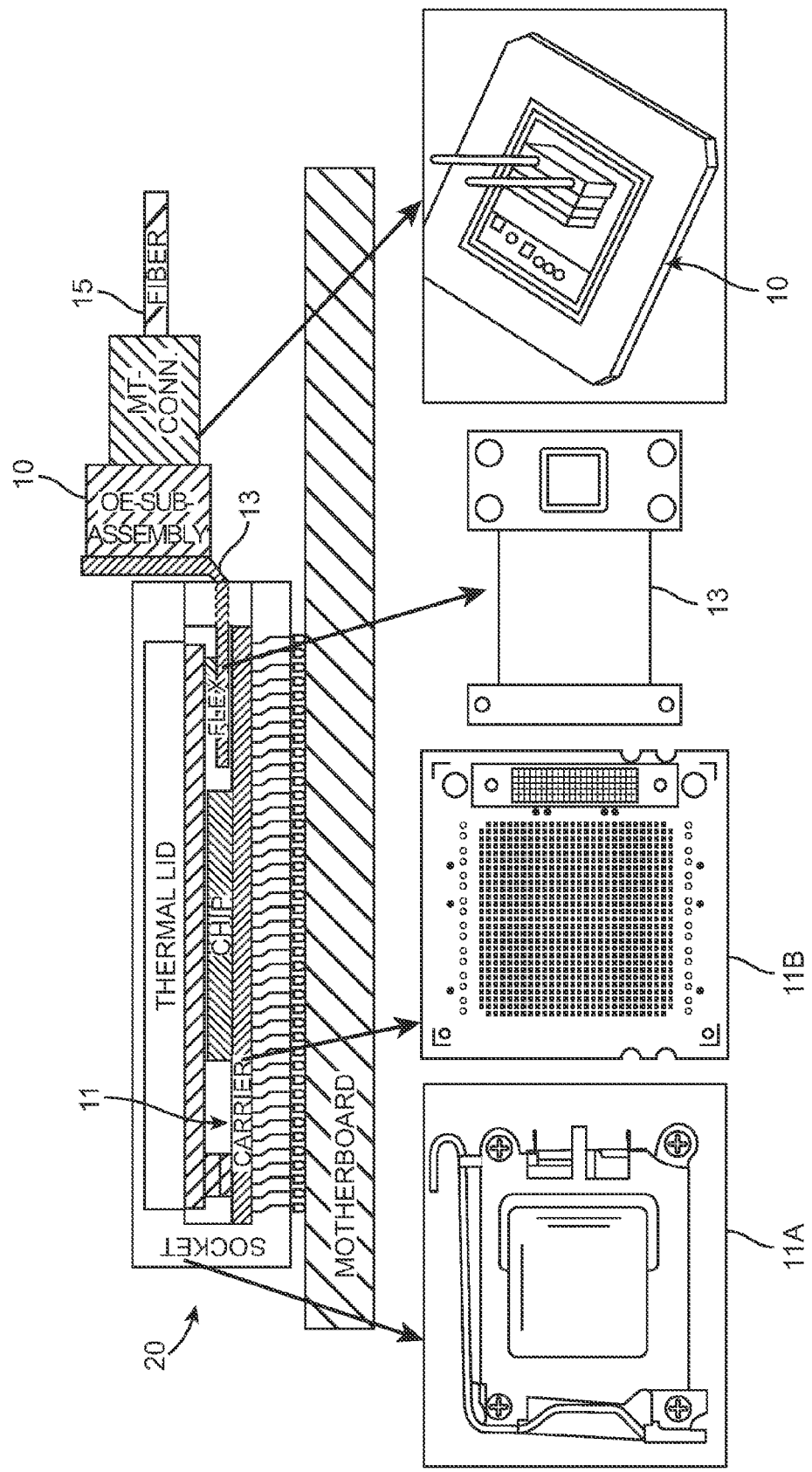
FIG. 2 shows a more detailed process for connection of an optical circuit board to an electronic module, according to an embodiment of demountable dry connection disclosed herein.

FIG. 2 shows a side view of an assembled electronic module 20, according to an embodiment of the invention, comprising said optical sub-assembly (optical circuit board) 10 and flexible electrical circuit 13 and electronics 11 including a processor (chip) socket 11A and carrier 11B for the socket 11A. The optical sub-assembly 10 provides an interface between a fiber optic cable 15 and the flex circuit 13. The flex circuit 13 is demountably connected to the electronics 11 and is preferably dry connected thereto. Specifically, the flex circuit 13 is demountably dry connected to the carrier 11B (not soldered). As such, the demountable flex circuit 13 and optical assembly 10 can be demounted from the carrier 11B and chip 11A. Such a demountable coupling provides a safer process for the optics at factory system assembly keeping the manufacturing and test processes separated for the different sub-system sections. This avoids creation of unnecessary adverse conditions to functioning circuit components when repairing actions are undertaken for non-functioning circuit components.

Cumulative yields of highly complex sub-systems may affect the overall affordability in terms of cost of a specific project. Optical devices are not only more critical but also more costly when compared to other electronic devices. As such, preserving costly (working) components versus low level repair actions, is important. Tests operations may take advantage of more simple constructions than highly integrated and structured sub-assemblies where attempts at repairing one section may affect others at the same time. Demountable coupling according to the invention provides a safer repair process for the above-mentioned situations.

A demountable coupling according to the invention further allows upgradeability and repair in the field without replacement of higher hierarchical sub-systems wherein a faulty part does not require removal of still functioning parts. In optical systems, there are optical paths that require certain level of high precision alignments, creating an optimized path used for optical transmissions. Such alignments, achieved either by active or passive methods, are susceptible to adverse impact caused by handling or other operations required during system upgrades or repair in the field. Demountable coupling according to the invention provides, for example, field upgrade-ability for electronics without affecting optical alignments of the optical portions of a module, mounted on board a complex electro-optical transceiver sub-system. Demountable coupling further allows replacing a faulty optical channel according to a specific procedure without affecting the driving electronics which may also perform the same functions for many other optical channels. Demountable coupling according to the invention preserves partitioning in the field upgrade-ability or service-ability of systems in the field.

Figure 3:
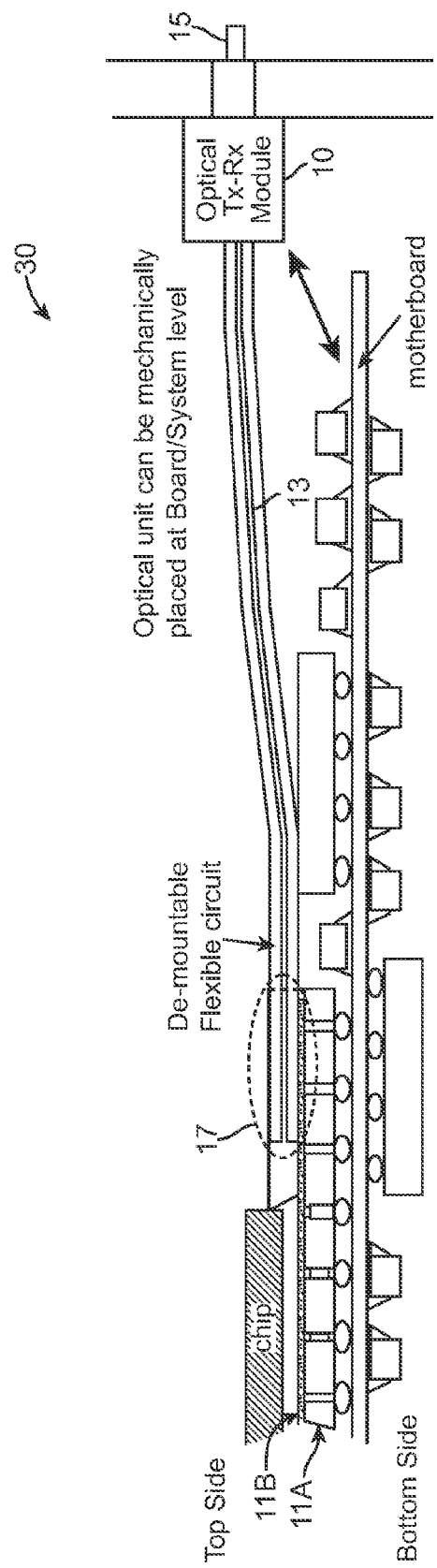
FIG. 3 shows a process for connection of an optical circuit board to an electronic module, according to an embodiment of demountable dry connection disclosed herein.

FIG. 3 shows another side view of an assembled electronic module 30, according to an embodiment of the invention, wherein the demountable flex circuit 13 is demountably electrically connected to the socket 11A (or may be connected to the carrier 11b, FIG. 2), at location 17. The interconnection is by mating of two compatible patterns of metal pads placed one on top of the other and kept in position by a localized locking system such as a clamp, or when used in socket application with a flange or other mechanical method. The removal of the mechanical holding system releases the parts from being electrically connected to each other.

Figure 4:
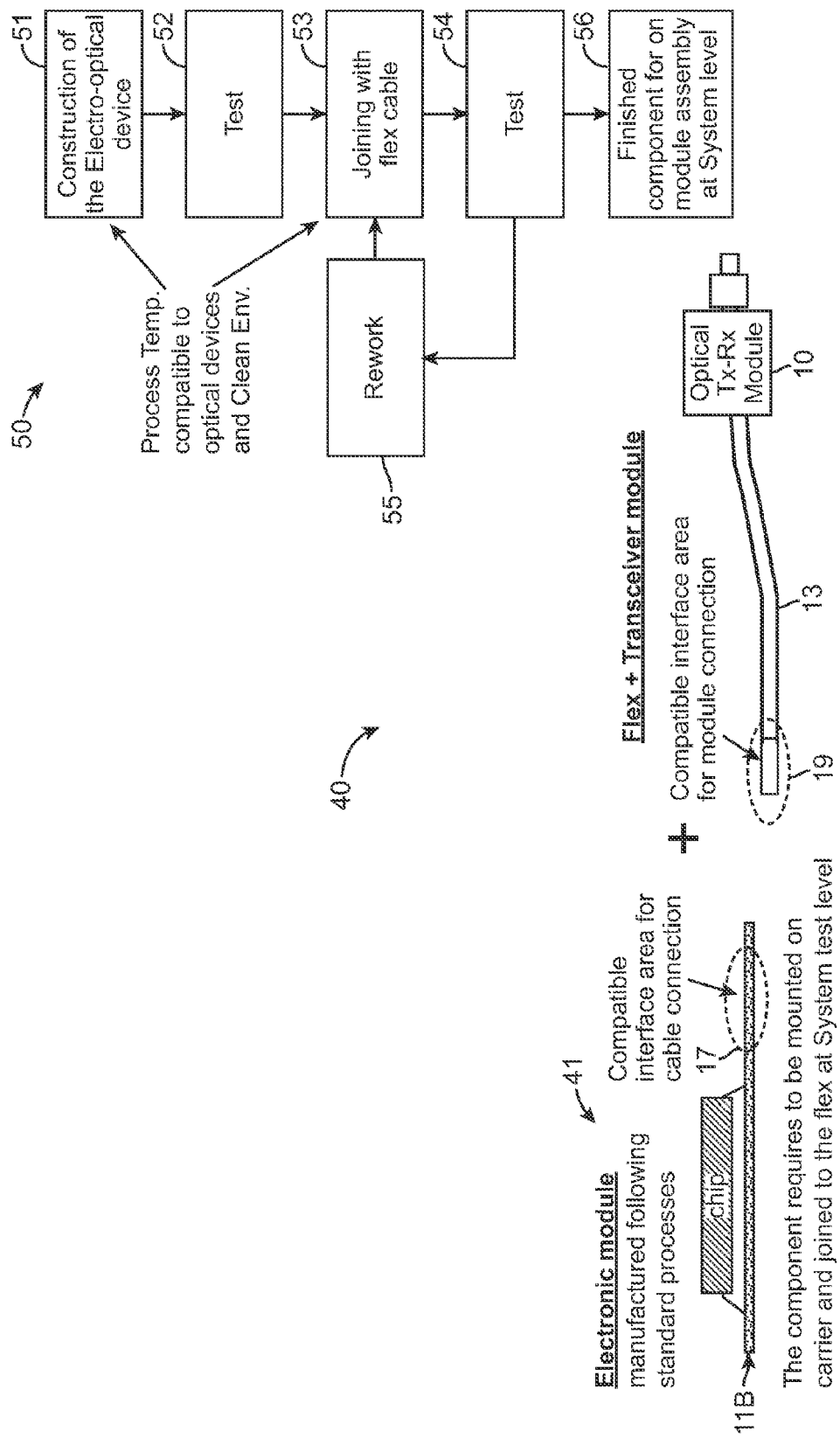
FIG. 4 shows a process for manufacturing and assembly for connection of an optical circuit board to an electronic module, according to an embodiment of demountable dry connection disclosed herein.

FIG. 4 shows a general two step process 40 according to an embodiment of the invention for first construing an electronic module 41 (including a chip in socket 11A on a motherboard) and then demountably connecting a module compatible interface 19 of the flex circuit 13 to a cable compatible interface 17 of the socket 11A. The interfaces 17 and 19 are dry connected as explained above. The interfaces can be easily disconnected simply by removing the mechanical locking mechanism without the need to apply additional processes such as de-soldering with high temperature exposures or other processes requiring chemical agents.

FIG. 4 also shows an assembly and test process 50 according to an embodiment of the invention including: constructions of the electro-optical device 10 (step 51), testing of the electro-optical device 10 (step 52), connecting/joining the electro-optical device 10 with the module 41 via the demountable flex-circuit 13 allowing multiple plug/unplug operations of the demountable flex-circuit 13 and the module 41 (step 53), test the combination of the electro-optical device 10 and module 41 (step 54), rework as necessary (step 55), and finish the combination of the electro-optical device 10 and module 41 for module assembly at system level (step 56). It is noted that in steps 51-53, process temperatures are compatible to the optical device 10 so as to not damage the device 10. This simplifies system assembly, debug, and possible reworks with a simple replacement of module 41 or replacement of optical unit 10, without committing one or the other to the removal of the bad part. Action to recover full functionality of a removed part is applicable on simplified Return of Investment (ROI) versus meeting reliability and system requirements targets.

Generally, reworking electronic modules using lead based or lead-free alloys may involve localized temperature solder reflow at 260°-290° C., including testing, performing functional go/no-go functional and, for example, many optical parts cannot withstand those temperatures. Tests are then performed again to address subsequent rework steps until a non-functional part is repaired. The rework process may be repeated a few times for complex electronics before thermal effects and chemical decapping agents will affect long term reliability and generate the requirement to scrap the parts. The demountable coupling according to the present invention allows separating critical devices from others which may undergo more severe process conditions in terms of temperatures or handling. The demountable coupling enables mounting and the demounting of separate sections of the electronic construction without intervention of temperatures or chemical agents which may adversely affect functionalities or product reliability in the field. Pad construction involves dry pad construction for building a connector-less connection between two electronics circuits.

Figure 5A:
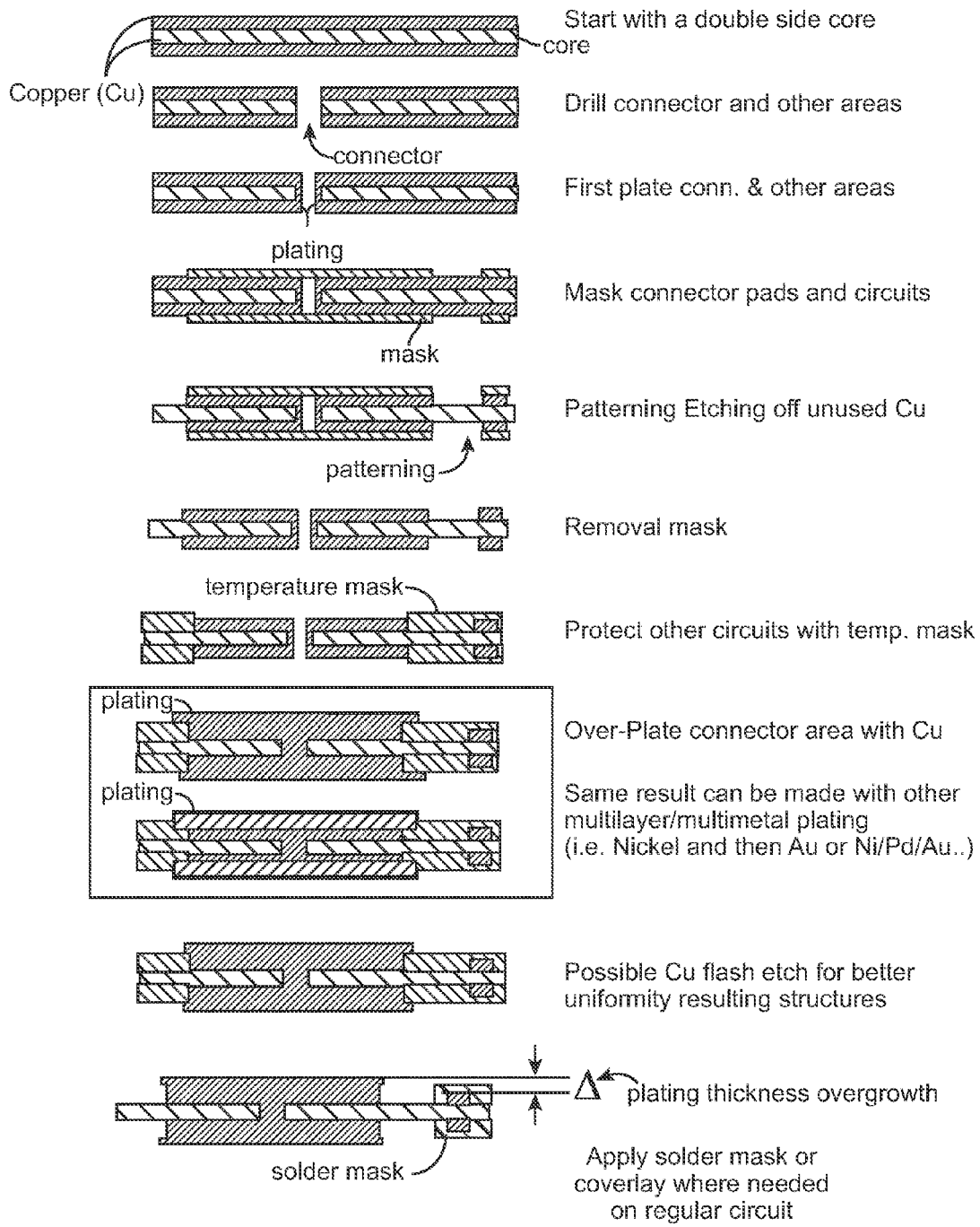
FIGS. 5A-B show example processes for dry pad construction, according to an embodiment of demountable dry connection disclosed herein.
Figure 5B:
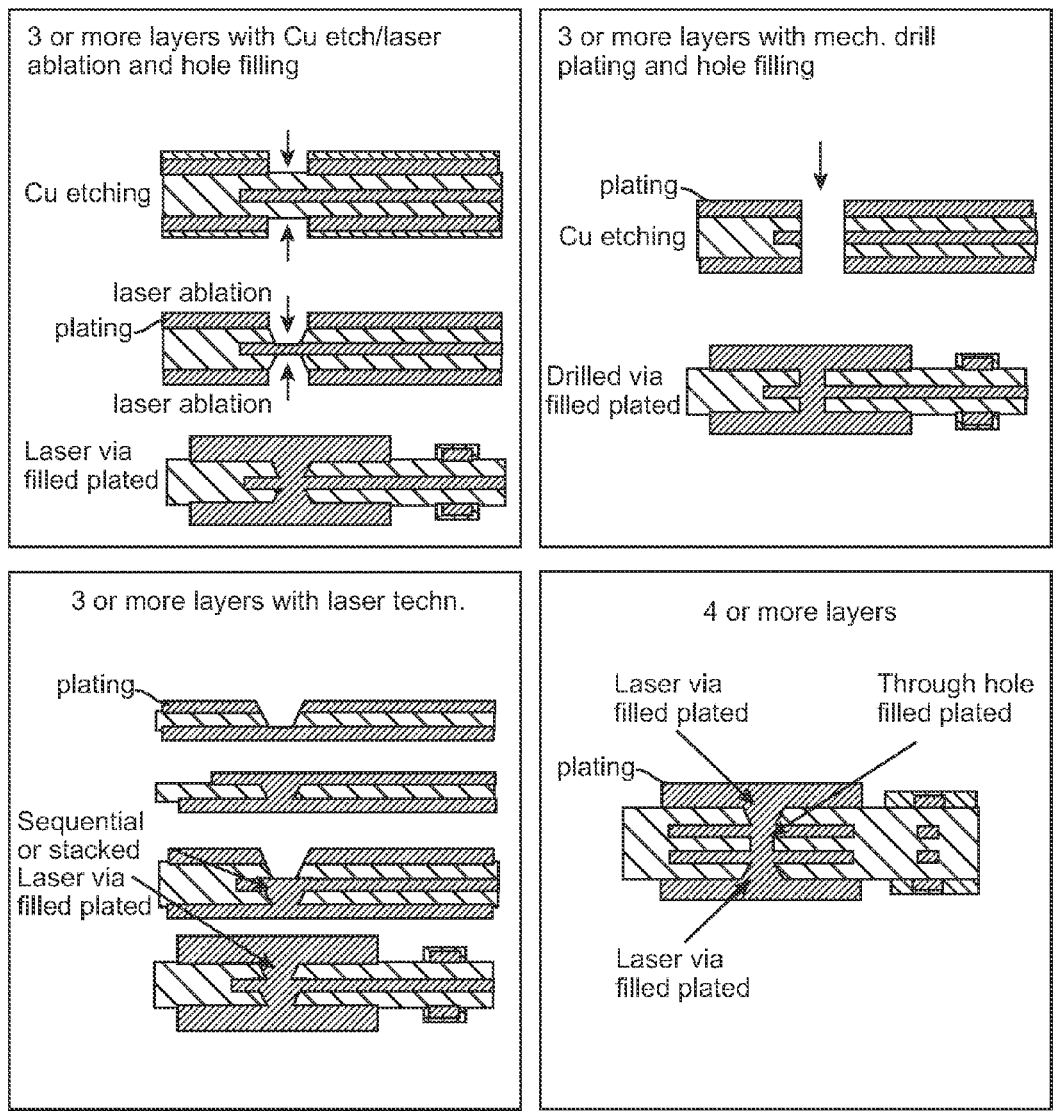

For obtaining a demountable dry coupling, as shown by example steps from top to bottom in FIGS. 5A-B, an embodiment of the invention involves varying the plating process of existing features (plated via holes, blind via holes) manufactured into the flex circuit 13 in such a way as to obtain an overgrowth of plating of the structures (FIG. 5A). This increased thickness of plated structures overcomes different heights and planarity problems of an array required to transfer the signals. The overall material bearing these structures is flexible in nature, resulting in a compliant material to exercise pressure by a clamping mechanism, wherein the plating structures represent main rigid structures crossing the flexible materials. As shown by example in FIG. 5B, interconnections can be made across the thickness of a flexible dielectric, such as by mechanical drilling or others may use laser drilling or material laser assisted ablation mixed with selective metal etching. The differences in manufacturing need not change the final result of rigid metalized structures embedded into a dielectric media, allowing connection of one pad within one or more layers of a substrate, to pads of another substrate by the application of a pressure/clamping method.

Figure 6A:
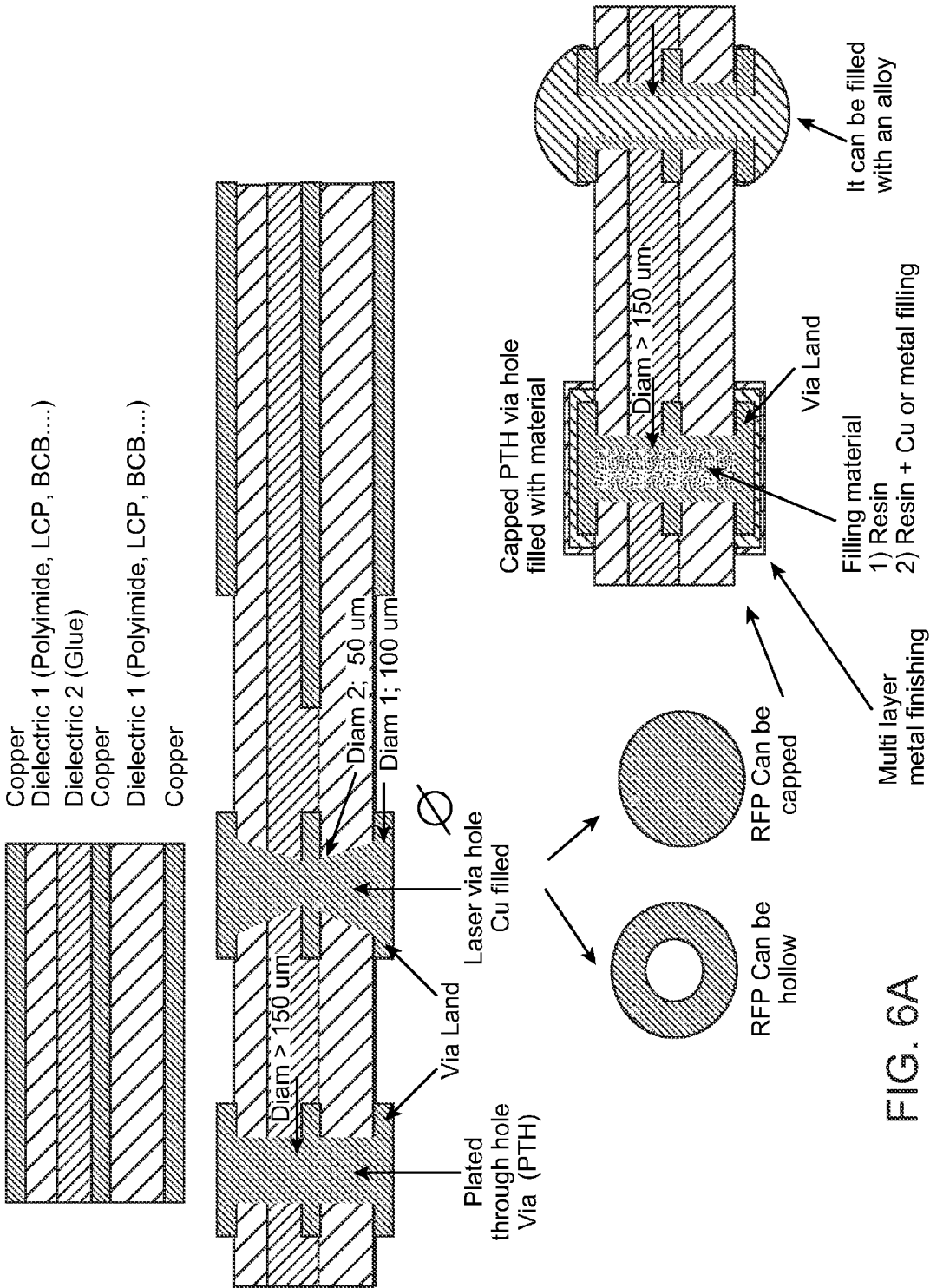
FIGS. 6A-F show example processes for dry pad construction, according to an embodiment of demountable dry connection disclosed herein.
Figure 6B:
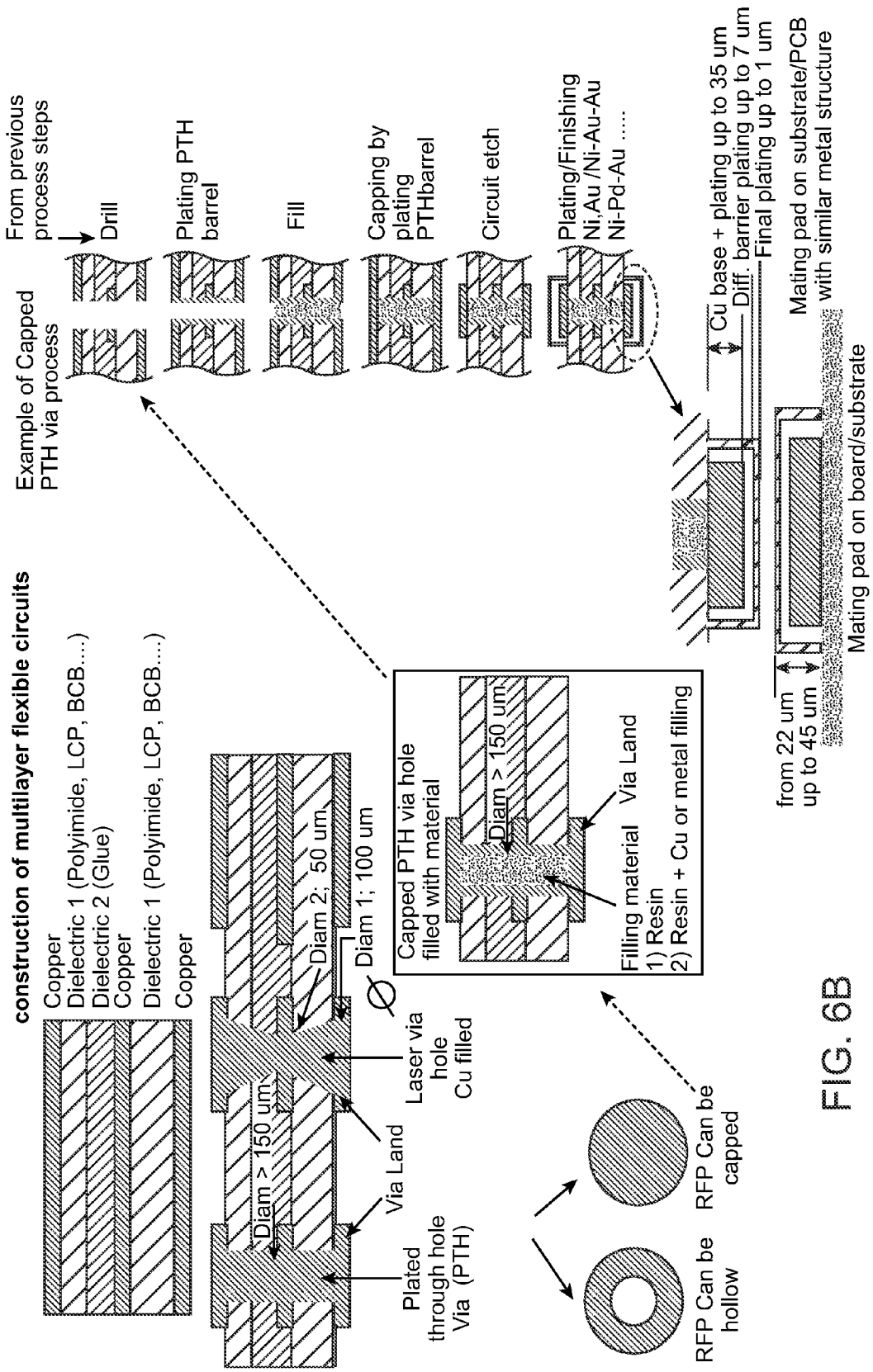
Figure 6C:
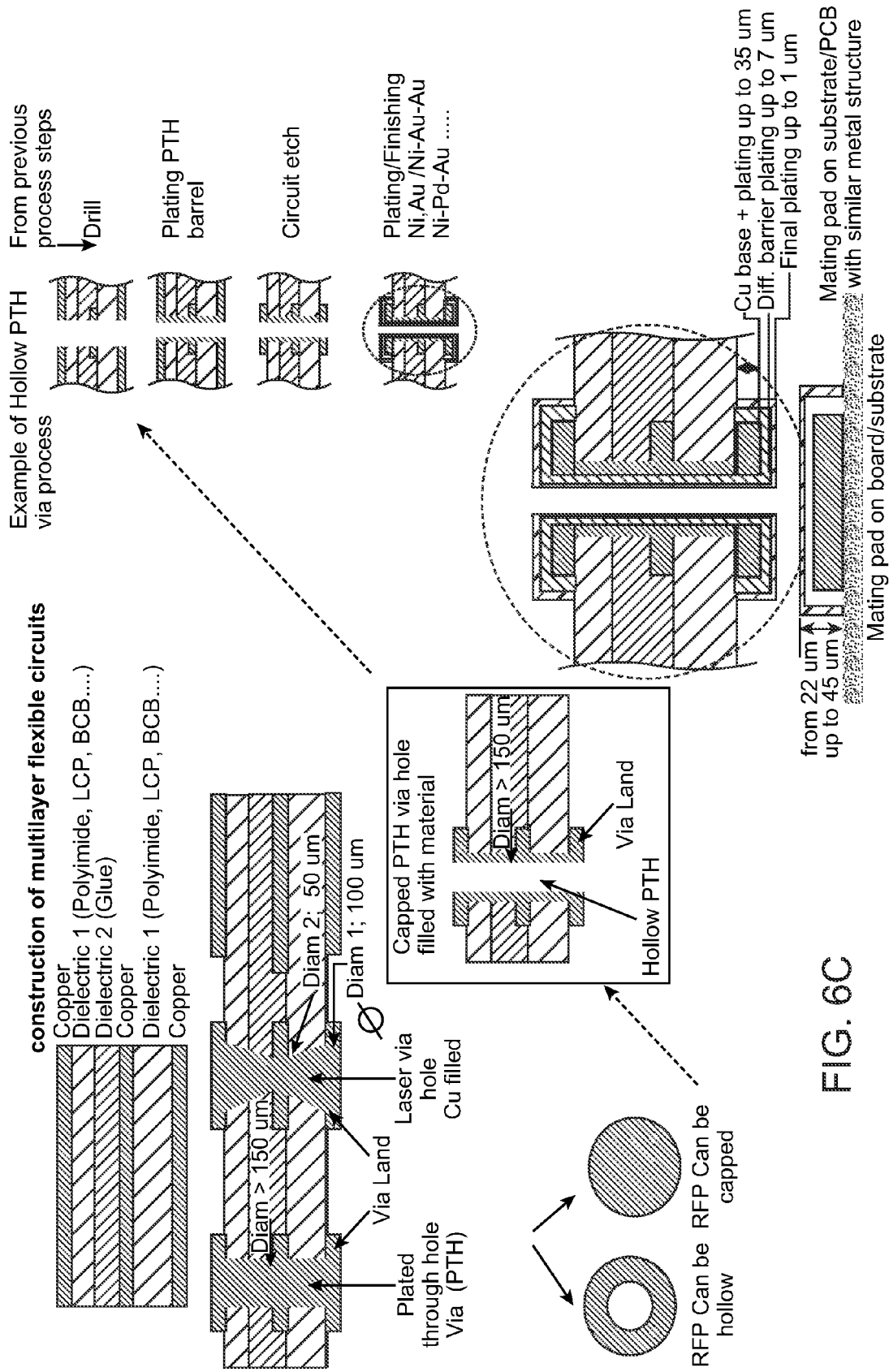
Figure 6D:
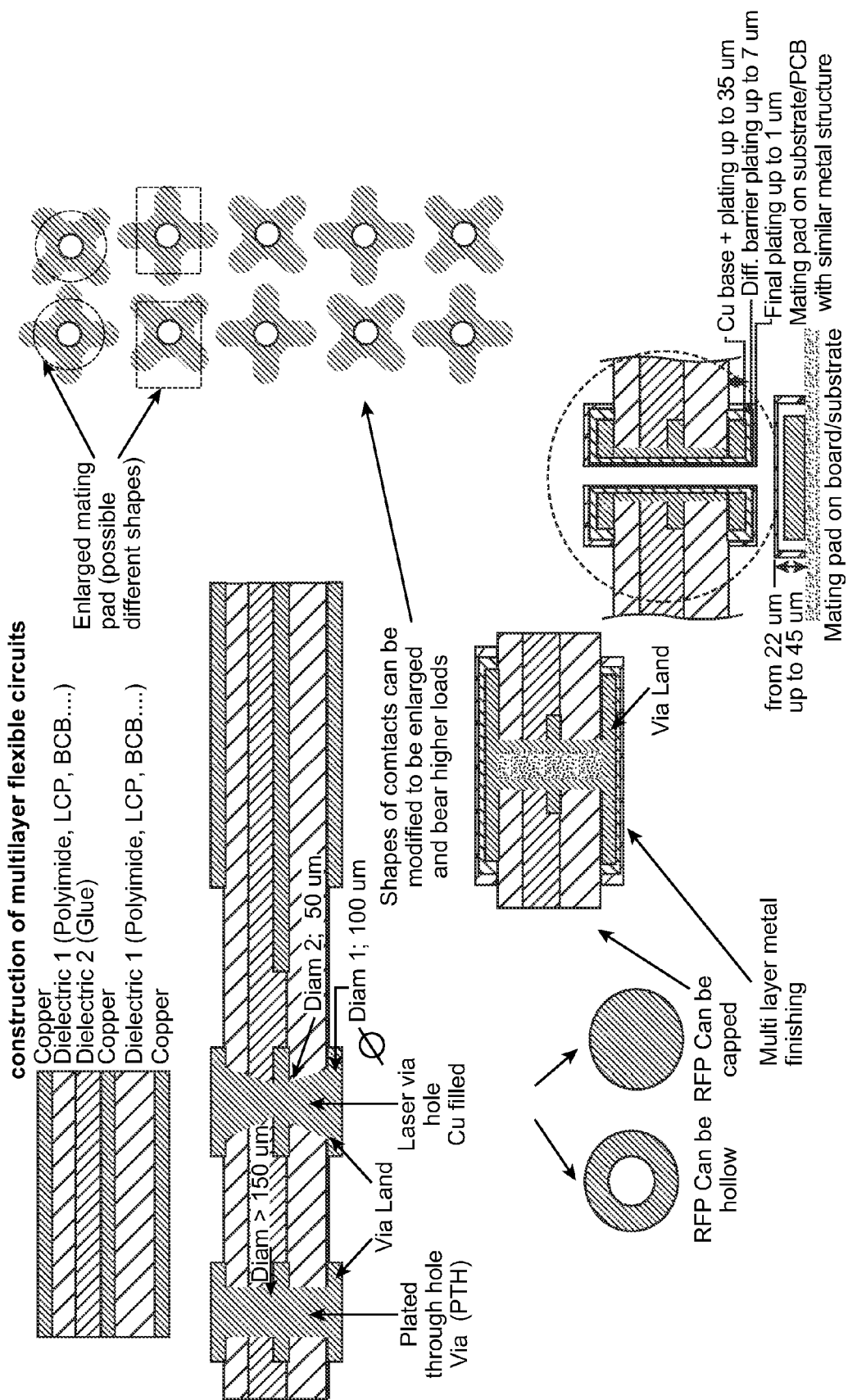

Accordingly, one embodiment of the disclosed demountable dry connection allows overgrown pads on one surface only (usually on Flex side) compatible with standard PCB surfaces and other substrates surfaces such as another flexible circuits and the like. The overgrown pads can also be obtained between two generic substrates (e.g., two flex substrates, two PCBs, two ceramic substrates, and any combination which uses metal pads for electrical connection). As shown by the examples in FIGS. 6A-D, the pads with electrically conductive finishing mating surfaces self adjust, compenetrating one into the other when they have different sizes to help larger tolerances of stacking, wherein the overgrown metal fits into a hollow mating pad on the other carrier a self centering one into the other. As shown in FIG. 6D, the pads with electrically conductive finishing mating surfaces with different hardness self adjust when compenetrating one into the other when they have different sizes to help larger tolerances of stacking.

Figure 6E:
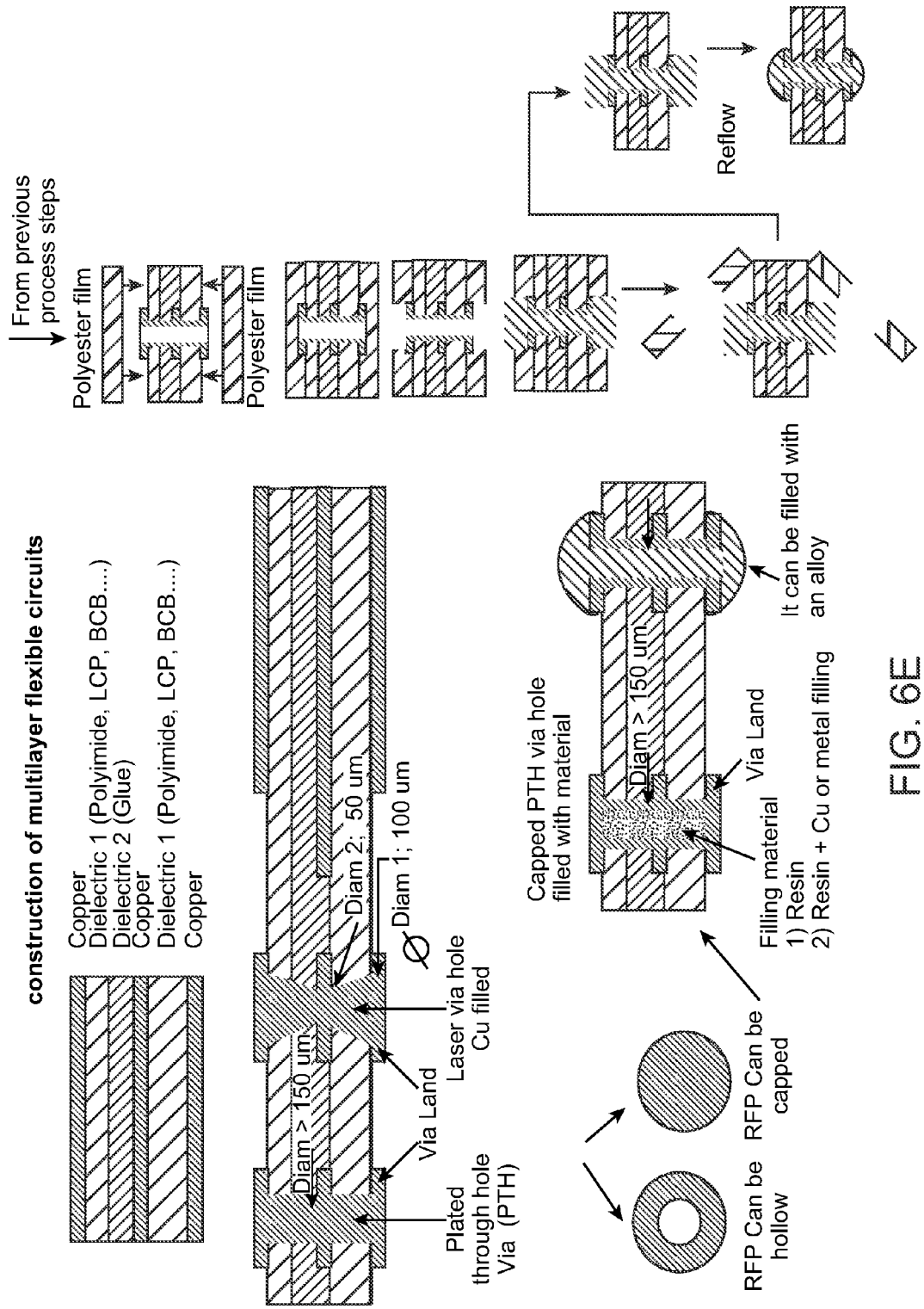
Figure 6F:
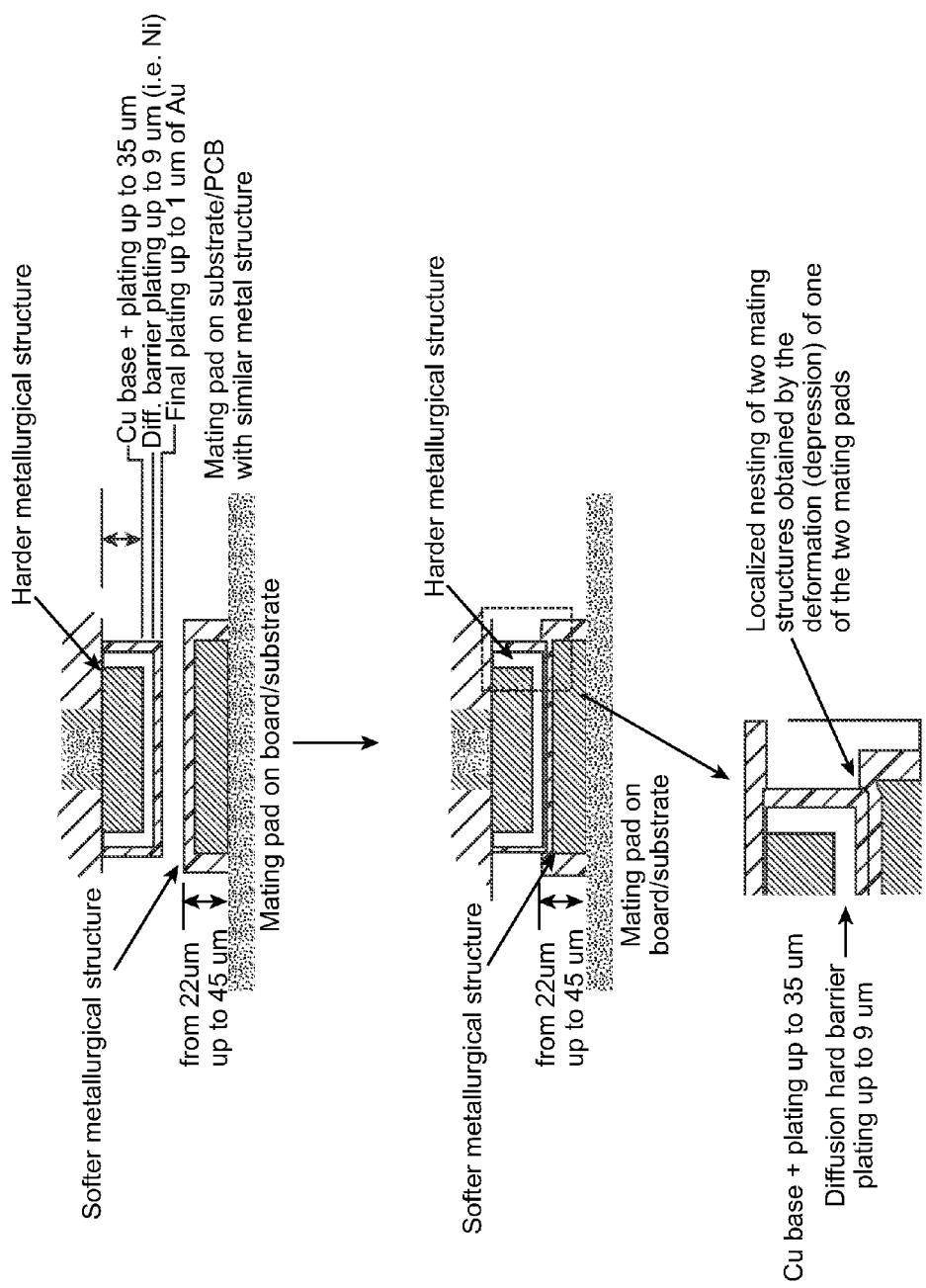

As shown by example in FIG. 6E, when overgrown metalization can be on one of the two (or multiple) mating surfaces obtained by metal/alloy depositions other than plating. Overgrown metalization can be on either the two (or multiple) mating surfaces. The mating surfaces may have different electrically conductive finishing with different hardness. The mating surfaces may also have the same electrically conductive finishing. As shown by example in FIG. 6F, electrically conductive finishing mating surfaces with different hardness self adjust by compenetrating one into the other. The pads with electrically conductive finishing mating surfaces with different hardness self adjust when compenetrating one into the other when they have different sizes to help larger tolerances of stacking, wherein one is hollow at the center and the other self centers into the other. A reverse design configuration may be used between the flex substrate and the module.

A compression force is applied to the flex circuit by a non-conductive clamp (assuming the contacts on the flex are fully exposed on the clamp side), resulting in contact with a multi-array pad matrix on the chip carrier, establishing a direct contact with the flex circuit without the need to use third party interposers. The level of contact quality can be improved with the removal of masking materials, reducing the possibility of errors in aligning pads over insulators surrounding the pads, either on the chip carrier or the flex cable to obtain a more reliable contacting mechanism in multiple plug/unplug operations. The contacts can be plated with a layer of Ni, and a flash of Au, or using one of the available plating technologies including also Ni, thick Au, Ni/Au/Pd, Chemical Tin, Ni/Pd/Au, Ag, Pt, Ni/Au/Rhodium and others.

Plating structures represent the main rigid structures crossing the flexible materials. Once a compression force is applied to the flex circuit by a non-conductive clamp (assuming the contact on the flex are fully exposed on the clamp side), the flex results in contact with a multi-array pad matrix on the chip carrier, establishing a direct contact between the cable and the board signals. The clamp can be an array of electrical contacts (e.g., ground and/or power), wherein the interconnect mechanism allows further applications such as application of a direct contact (for a shielding structure surrounding the electronics) directly to the application/board ground network.

Similarly, a derivative of the structure can be used to carry higher levels of currents through a dedicated external metal structure which becomes an integral part of the clamping mechanism. This would bypass possible functional limitations of the cable itself (e.g., maximum number of $\mu A/\mu m^2$ based on conductor cross-section), or carrying power form external sources not being connected at all to/by the flex cable.

Implementation of the structure may involve a clamping of the stack of different cables (more than one), stacked and aligned by a mechanical alignment key. The vertical connections bear signals and/or power domains (e.g., voltages and/or ground). The stacking does not use additional components beyond the current already existing standard structures provided on the parts by the construction of the same parts.

For example, pads on the flex circuit are required as standard footprint to interface other parts. When stacking such pads to other pads in a conventional approach, also called Pad on Pad, it is common practice to insert a layer of an additional material which carries some metal structures to establish connection between different components. The demountable coupling according to the invention avoids these additional materials (e.g., metal loaded elastomers or others materials as interconnection materials or as electrical interposers). The demountable coupling according to the invention allows the removal of these additional materials and at the same time allowing good electrical lower resistance path with lower compressive load.

As is known to those skilled in the art, the aforementioned example architectures described above, according to the invention, can be implemented in many ways, such as logic circuits, application specific integrated circuits, as firmware, etc. Though the invention has been described with reference to certain versions thereof; however, other versions are possible. Therefore, the spirit and scope of the appended claims should not be limited to the description of the preferred versions contained herein.

What is claimed is:

1. A method for connection of an electronic module to a substrate, comprising:
   providing an electronic module;
   providing a substrate carrying electrical and/or optical circuits;
   connecting a connector electrical circuit between the substrate and the electronic module, wherein the connector electrical circuit is electrically demountable dry connected to the electronic module;

wherein the connector electrical circuit comprises a flexible electrical circuit having a first compatible interface area for connection to the electronic module, the first compatible interface area including a first overgrown metal pad with noble metal finishing;

wherein the electronic module includes a second compatible interface area for connection to the flexible electrical circuit, the second compatible interface area including a second metal pad with noble metal finishing metallurgical compatible with the finishing of the first overgrown metal pad; and wherein said connecting the connector electrical circuit between the substrate and the electronic module further includes demountable dry connecting the flexible electrical circuit to the electronic module, wherein the first and second overgrown metal pads self adjust one into the other based on applied vertical loading connecting electrically differing parts when in contact;

wherein the first overgrown metal pad for the compatible interface is of different hardness than the second overgrown metal pad of the second compatible interface; and wherein said demountable dry connecting the flexible electrical circuit to the electronic module further includes self adjust penetrating the first and second overgrown metal pads one into the other, wherein the flexible electrical circuit is demountable dry connected to the electronic module, wherein when in contact the interface areas self adjust one into the other based on applied vertical loading connecting electrically differing parts of different hardness.

2. The method of claim 1 wherein:
the second compatible interface area has a hollow pad configuration to self adjust and self center with the first compatible interface area including said first overgrown metal pad with noble metal finishing of the flexible electrical circuit.

3. The method of claim 1 wherein:
the first overgrown metal pad of the flexible electrical circuit includes one or multiple mating surfaces obtained by metal or alloys deposition other than plating; and
connecting a connector electrical circuit between the substrate and the electronic module further includes demountable dry connecting the flexible electrical circuit to the electronic module, wherein when in contact the first and second metal pads self adjust one into the other based on applied vertical loading connecting electrically differing parts.

4. The method of claim 1 wherein
the first and second pads have different dimensions and shapes to enable better tolerance for stacking and self centering actions in demountable dry connecting the flexible electrical circuit to the electronic module.

5. The method of claim 4 wherein
the first pad has a hollow pad configuration to self adjust and self center with the second pad for demountable dry connecting the flexible electrical circuit to the electronic module.

6. The method of claim 4, wherein:
the second pad has a hollow pad configuration to self adjust and self center with the first pad for demountable dry connecting the flexible electrical circuit to the electronic module.

7. The method of claim 1 wherein
one compatible interface area comprises flexible material and another compatible interface area comprises plating main rigid structures, dry demountable connecting includes pressing compatible interface areas together by application of clamping mechanism, wherein the plating structures cross the flexible material for demountable coupling.

8. The method of claim 7 wherein:
the electronic module includes a multi-array pad matrix; and
demountable coupling further includes: applying a compression force to the flexible circuit board via a non-conductive clamp, resulting in contact with the multi-array pad matrix, establishing a direct contact with the flexible circuit board.

9. The method of claim 7 wherein demountable coupling further includes:
performing plating to obtain an overgrowth of plating structures for the multi-array pad matrix, providing increased thickness structures to overcome different heights and planarity features of the compatible interface areas for improved contact quality and signal transfer.

10. The method of claim 9 wherein demountable coupling further includes:
improving level of contact quality by removing masking materials after plating, thereby reducing the possibility of errors in aligning pads over insulators surrounding the pads on either compatible interface area in multiple plug/unplug operations.

11. The method of claim 9 further comprising:
plating the pads with a layer of Ni, and a flash of one or more of: Au, Ni, thick Au, Ni/Au/Pd, Pd, Chemical Tin, Ni/Pd/Au, Ag, Pt, Ni/Au/Rhodium.

12. A method for connection of an electronic module to a substrate, comprising:
providing an electronic module;
providing a substrate carrying electrical and/or optical circuits;
providing a flexible electrical circuit for connection between the substrate and the electronic module,
the flexible electrical circuit having a first compatible interface area for connection to the electronic module, the first compatible interface area including a first overgrown metal pad with noble metal finishing;
the electronic module including a second compatible interface area for connection to the flexible electrical circuit, the second compatible interface area including a second metal pad with noble metal finishing metallurgical compatible with the finishing of the first overgrown metal pad, wherein the first overgrown metal pad of the first compatible interface area is of different hardness than the second overgrown metal pad of the second compatible interface; and
placing the first pad into bi-dimensional arrays on the flexible electrical circuit and connecting the flexible electrical circuit between the substrate and the electronic module, wherein the flexible electrical circuit is electrically demountable dry connected to the electronic module, wherein when in contact the first and second metal pads self adjust one into the other based on applied vertical loading connecting electrically differing parts, wherein said connecting the flexible electrical circuit between the substrate and the electronic module comprises self adjust penetrating the first and second overgrown metal pads one into the other, wherein the flexible electrical circuit is demountable dry connected to the electronic module, wherein when in contact the interface areas self adjust one into the other based on applied vertical loading connecting electrically differing parts of different hardness.

13. The method of claim 12 wherein demountable coupling further comprises:
applying a compression force to the flexible electrical circuit via a dedicated-conductive clamp, providing a direct electrical contact with a multi-array pad matrix on the electronic module comprising a chip carrier, bypassing functional limitation, such as current density capability (A/mm.sup.2), of lower hierarchical interconnection level such as sockets or PCBs.

14. The method of claim 13 wherein
the electronic module comprises a carrier for a chip mounted thereon, and the circuit board includes an optical transceiver module.

15. The method of claim 14 wherein
the demountable coupling is achieved by applying a compression force to the flexible electrical circuit via a non-conductive clamp, resulting in contact with a multi-array pad matrix on the chip carrier, establishing a direct contact with the flexible electrical circuit\.

16. The method of claim 15 wherein
the demountable coupling is achieved by removal of masking materials, reducing the possibility of errors in aligning pads over insulators surrounding the pads, either on the chip carrier or the flexible electrical circuit to obtain a more reliable contacting mechanism in multiple plug/unplug operations.

\* \* \* \* \*